(12) United States Patent
Wada et al.

(10) Patent No.: US 8,279,700 B2
(45) Date of Patent: Oct. 2, 2012

(54) SEMICONDUCTOR ELECTRICALLY PROGRAMMABLE FUSE (EFUSE) HAVING A POLYSILICON LAYER NOT DOPED WITH AN IMPURITY ION AND A PROGRAMMING METHOD THEREOF

(75) Inventors: Osamu Wada, Kanagawa (JP); Toshimasa Namekawa, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 310 days.

(21) Appl. No.: 12/656,859

(22) Filed: Feb. 18, 2010

(65) Prior Publication Data
US 2010/0290303 A1    Nov. 18, 2010

(30) Foreign Application Priority Data
May 14, 2009    (JP) .................................. 2009-117872

(51) Int. Cl.
*G11C 17/16* (2006.01)
*H01L 23/52* (2006.01)
(52) U.S. Cl. ......... 365/225.7; 365/96; 365/63; 257/529; 257/530
(58) Field of Classification Search .................... 365/51, 365/63, 96, 163, 225.7; 257/529, 530
See application file for complete search history.

(56) References Cited

U.S. PATENT DOCUMENTS 6,624,499 B2 * 9/2003 Kothandaraman et al. ... 257/529
7,109,564 B2 * 9/2006 Wu et al. ........................ 257/529
7,378,718 B2 * 5/2008 Tsutsui ........................... 257/529
7,759,226 B1 * 7/2010 Lee et al. ....................... 438/467

FOREIGN PATENT DOCUMENTS

| JP | A-2007-266061 | 10/2007 |
| JP | A-2007-299926 | 11/2007 |
| WO | WO 97/12401 | 4/1997 |

OTHER PUBLICATIONS

C. Kothandaraman, et al., "Electrically Programmable Fuse (eFuse) Using Electromigration in Silicides," IEEE Electron Device Letters, vol. 23, No. 9 (Sep. 2002), pp. 523-525 (discussed on p. 2 of the Specification).
Background Art Information Sheet provided by applicants (Oct. 27, 2009) (1 page total).

* cited by examiner

*Primary Examiner* — Andrew Q Tran
(74) *Attorney, Agent, or Firm* — Posz Law Group, PLC

(57) ABSTRACT

A semiconductor device includes a first terminal, a second terminal, and a fuse link that connects between the first terminal and the second terminal. The first terminal and the fuse link have a polysilicon layer doped with an impurity ion and a layer containing a metal element laminated on the polysilicon layer. The second terminal has a polysilicon layer not doped with an impurity ion and a layer containing a metal element laminated on the polysilicon layer, in at least a part of an end side connected to the fuse link.

10 Claims, 4 Drawing Sheets

SEMICONDUCTOR ELECTRICALLY PROGRAMMABLE FUSE (EFUSE) HAVING A POLYSILICON LAYER NOT DOPED WITH AN IMPURITY ION AND A PROGRAMMING METHOD THEREOF

CROSS-REFERENCE TO RELATED APPLICATIONS

This application is based upon and claims the benefit of priority from the prior Japanese Patent Application No. 2009-117872, filed on May 14, 2009; the entire contents of which are incorporated herein by reference.

BACKGROUND OF THE INVENTION

1. Field of the Invention

The present invention relates to a semiconductor device.

2. Description of the Related Art

The present invention is directed to a current fuse element that is a semiconductor device formed on a semiconductor substrate together with a semiconductor integrated circuit, as a storage element used in a one-time programmable (OTP) memory which is programmable only once.

In a semiconductor integrated circuit in recent years, the OTP memory has been an essential element to store redundancy replacement information as to which one of cells of a memory having redundancy, such as a dynamic random access memory (DRAM) and a static random access memory (SRAM), is to be replaced by a redundancy cell, identification (ID) information specific to a chip, or tuning information of an analog circuit.

An electrically programmable fuse (hereinafter, "eFuse") element has been used mainly as a storage element used in the OTP memory. Types of eFuse elements include a gate-oxide-film breakdown-fuse element, a current fuse element or the like, and various proposals concerning eFuse have been made.

The gate-oxide-film breakdown-fuse element is an antifuse-type fuse element that reduces the resistance by causing a gate oxide film of a metal-oxide semiconductor (MOS) transistor to generate a dielectric breakdown by applying a high voltage to this gate oxide film. On the other hand, the current fuse element is a type of fuse element that changes the resistance value by fusing a wiring or changing a wiring structure by passing a large current to the wiring itself.

A current fuse element as a subject of the present invention is explained below. A fuse element using a polysilicon wiring obtained by silicificating a band region of a predetermined width of a surface of a polysilicon layer by reacting this region with a metal such as cobalt (Co), nickel (Ni), and titanium (Ti) is known as a kind of a current fuse element used for an eFuse element. Silicified polysilicon is used as a gate material.

As a method of programming such a polysilicon fuse element, the following method has been proposed. A large current is passed to silicified polysilicon, a metal element of a silicide layer is shifted to the same direction as that of a flow of electrons based on an electromigration phenomenon, and the silicide layer is disconnected, thereby increasing its resistance (for example, see "Electrically Programmable Fuse (eFUSE) Using Electromigration in Silicides" IEEE Electron Device Letters, Vol. 23, No. 9, September 2002).

A fuse element using this polysilicon wiring structure does not require a high voltage at a programming time as compared with a gate-oxide-film breakdown-fuse element. Therefore, this fuse element can be programmed without giving excessive stress to transistors constituting a logic circuit.

However, the fuse element using the polysilicon wiring structure cannot have a large resistance value after the programming because of fluctuation in a program voltage, when a metal element does not shift sufficiently based on the electromigration phenomenon. Therefore, there is a risk that the resistance value varies after the programming and that a sufficient current ratio before and after programming the fuse element cannot be obtained.

Furthermore, when there is a region in which a silicide layer is not uniformly generated in the fuse element, the initial resistance value may be varied and the fuse element may lose its reliability.

SUMMARY OF THE INVENTION

According to one aspect of the present invention, a semiconductor device includes a first terminal; a second terminal; and a fuse link that connects between the first terminal and the second terminal, wherein the first terminal and the fuse link have a polysilicon layer doped with an impurity ion and a layer containing a metal element laminated on the polysilicon layer, and the second terminal has a polysilicon layer not doped with an impurity ion and a layer containing a metal element laminated on the polysilicon layer, in at least a part of an end side connected to the fuse link.

DETAILED DESCRIPTION OF THE INVENTION

Exemplary embodiments of a semiconductor device according to the present invention will be explained below in detail with reference to the accompanying drawings. The present invention is not limited to the embodiments.

Figure 1:
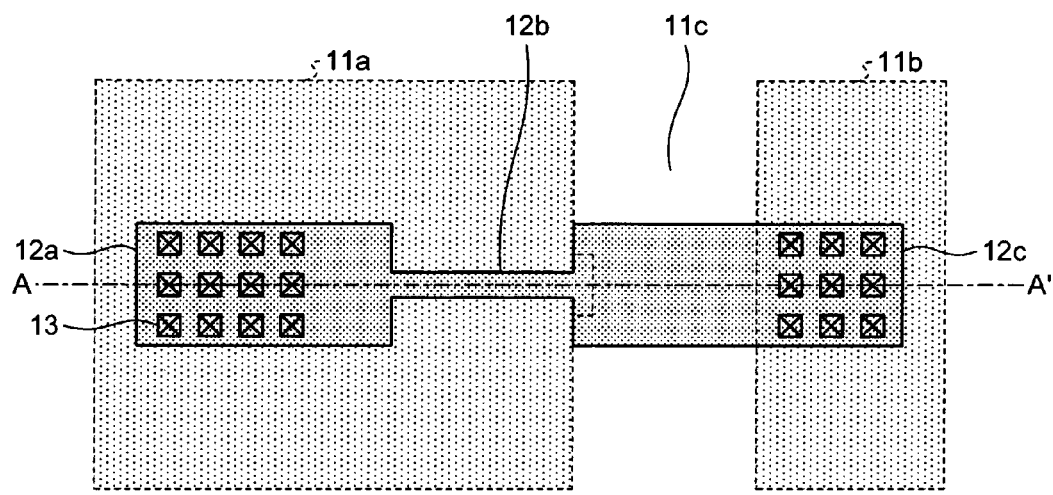
FIG. 1 is a layout diagram for explaining a basic configuration of a semiconductor device according to a first embodiment of the present invention.

FIG. 1 is a layout diagram for explaining a basic configuration of a semiconductor device according to a first embodiment of the present invention. As shown in FIG. 1, a fuse element as the semiconductor device according to the first embodiment includes a first terminal 12a, a second terminal 12c, and a fuse link 12b having a narrow band shape connecting the ends of both terminals. A plurality of contacts 13 are provided in the first terminal 12a and the second terminal 12c, respectively.

In FIG. 1, regions 11a and 11b of predetermined areas doped with an $N^+$ or $P^+$ impurity ion sandwich a region 11c of a predetermined width not doped with an impurity ion, on a polysilicon layer. A layer containing a metal element is laminated on the region 11a to form a total plane shape of the first terminal 12a and the fuse link 12b. A layer containing a metal element is laminated on a combined region of the region 11c and the region 11b to form a plane shape of the second terminal 12c. The contacts 13 of the first and second terminals 12a and 12c are formed on a layer containing a metal element, respectively.

In short, each of the first terminal 12a, the fuse link 12b, and the second terminal 12c is configured by a polysilicon layer and a layer containing a metal element laminated on the polysilicon layer. The polysilicon layer of the first terminal 12a and the fuse link 12b is doped with an $N^+$ or $P^+$ impurity ion. On the other hand, on the polysilicon layer of the second terminal 12c, a region of a predetermined width (the region 11c) at an end connected to the fuse link 12b is not doped with an impurity ion, and a region of a predetermined width (the region 11b) at an end connected to the outside provided with the contacts 13 is doped with an $N^+$ or $P^+$ impurity ion. At a boundary between the region 11a and the region 11c, an $N^+$ or $P^+$ impurity ion is doped in a range indicated by a broken line in FIG. 1 such that a connection end of the fuse link 12b enters the region 11c to ensure a connection between the fuse link 12b and the second terminal 12c.

Figure 2:
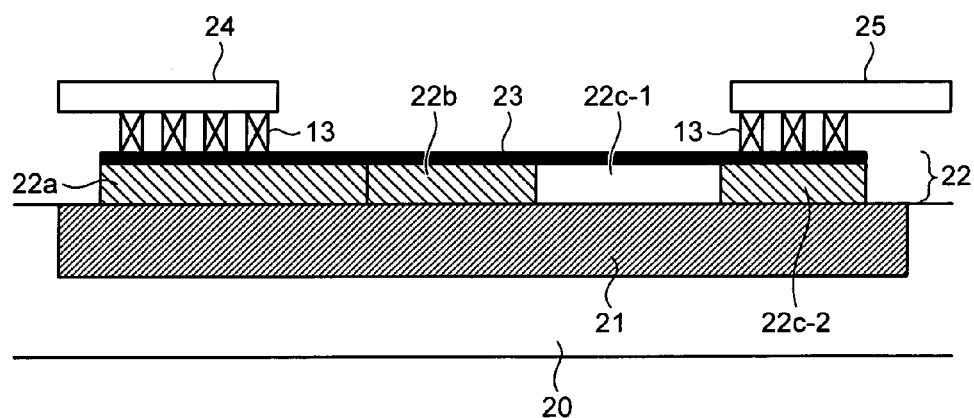
FIG. 2 is a cross-sectional view along a line A-A' shown in FIG. 1.

Specifically, the fuse element according to the first embodiment has a configuration as shown in FIG. 2. FIG. 2 is a cross-sectional view along a line A-A' shown in FIG. 1. In FIG. 2, a silicon oxide film 21 is formed on a semiconductor substrate 20. A polysilicon layer 22 is formed on the silicon oxide film 21. The regions 11a, 11c, and 11b shown in FIG. 1 are formed on the polysilicon layer 22. The regions 11a and 11b are doped with an $N^+$ or $P^+$ impurity ion. A silicide layer 23 as a layer containing a metal element is formed in a self-aligned manner in a region in which a plane shape of the fuse element shown in FIG. 1 is formed in the regions 11a, 11c, and 11b formed on the polysilicon layer 22.

In FIG. 2, the polysilicon layer 22 is divided into a polysilicon layer 22a at the first terminal 12a side shown in FIG. 1, a polysilicon layer 22a at the fuse link 12b side, and polysilicon layers 22c-1 and 22c-2 at the second terminal 12c side.

The polysilicon layers 22a and 22b are in the region 11a, and the polysilicon layer 22c-2 is in the region 11b. These polysilicon layers are doped with an $N^+$ or $P^+$ impurity ion. On the other hand, the polysilicon layer 22c-1 is in the region 11c, and is not doped with an impurity ion.

A plurality of the contacts 13 shown in FIG. 1 are formed on the silicide layer 23 at the first terminal 12a side shown in FIG. 1, and a metal wiring 24 is connected to these contacts 13. The contacts 13 shown in FIG. 1 are formed on the silicide layer 23 at the second terminal 12c side shown in FIG. 1, and a metal wiring 25 is connected to these contacts 13.

Arsenic (As) and phosphorus (P) are representative examples of an impurity ion doped as an $N^+$ impurity ion. Boron (B) is a representative example of an impurity ion doped as a $P^+$ impurity ion. A metal element constituting the silicide layer 23 includes nickel (Ni) and the like, but is not limited to nickel, and titanium (Ti), cobalt (Co), and tungsten (W) can be also used for the silicide layer 23.

Figure 3:
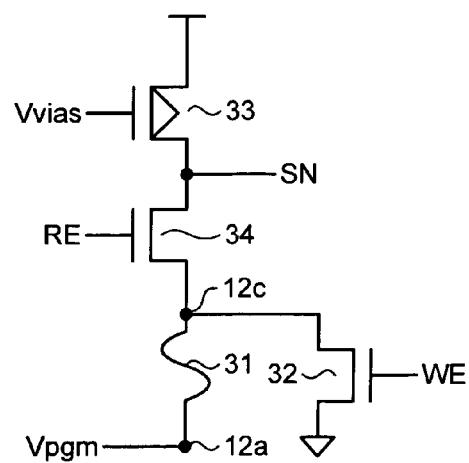
FIG. 3 is a circuit diagram illustrating a configuration example of a circuit that programs a fuse element shown in FIG. 1.

FIG. 3 is a circuit diagram of a configuration example of a circuit that programs the fuse element shown in FIG. 1. As shown in FIG. 3, the circuit that programs the fuse element has a configuration having a P-channel metal-oxide semiconductor (PMOS) transistor 33 and N-channel metal-oxide semiconductor (NMOS) transistors 34 and 32 connected in series in this order between a power source and a circuit ground. In this circuit configuration, the second terminal 12c of the fuse element 31 is connected to a serial connection end of the NMOS transistors 34 and 32. The first terminal 12a of the fuse element 31 is applied with a program voltage Vpgm.

The PMOS transistor 33 is controlled in an off-state at a programming time, and is controlled in an on-state at a reading time, by a bias signal Vvias. The NMOS transistor 34 is controlled in an off-state at a programming time, and is controlled in an on-state at a reading time, by a program signal WE. The first terminal 12a of the fuse element 31 is supplied with the program voltage Vpgm set at a high voltage at a programming time, and is supplied with the program voltage Vpgm set at the same potential as that of the circuit ground at a reading time. A serial connection end of the PMOS transistor 33 and the NMOS transistor 34 becomes an output end at a reading time, and a storage node signal SN is extracted from this end.

Figure 4:
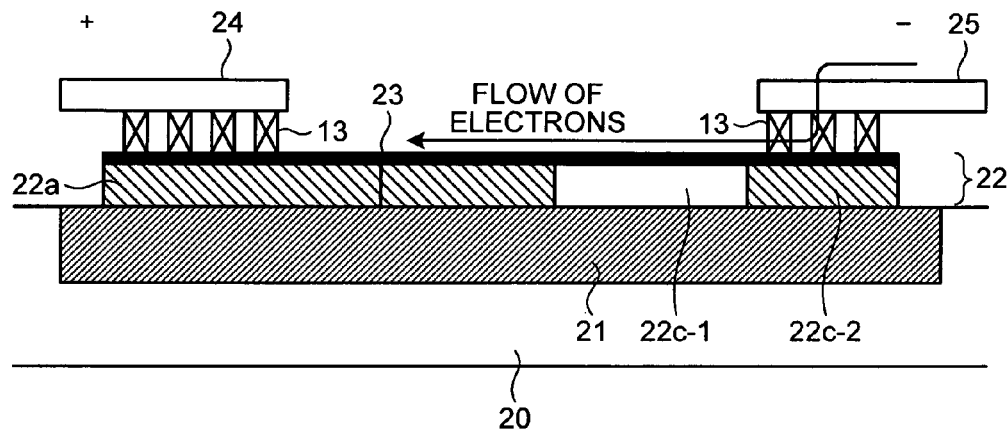
FIG. 4 is a cross-sectional view for explaining a programming operation of the fuse element shown in FIG. 1.
Figure 5:
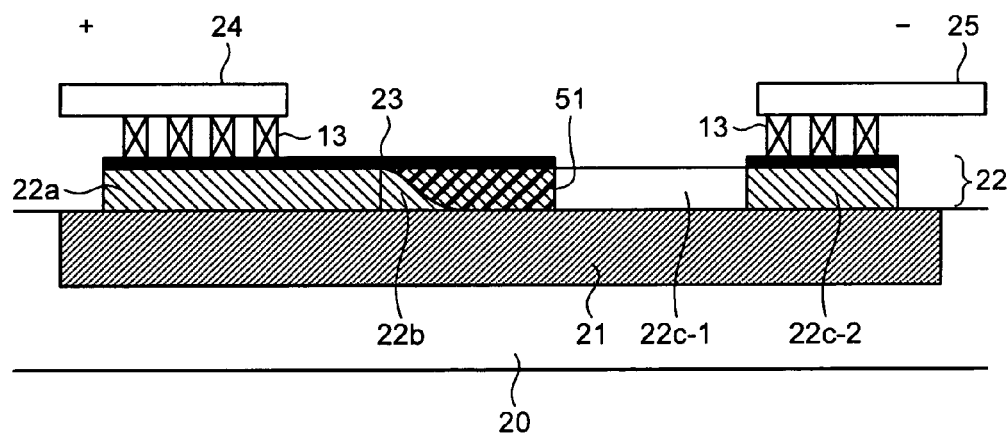
FIG. 5 is a cross-sectional view for explaining a state after the programming operation of the fuse element shown in FIG. 1.

An operation of programming the fuse element 31 is explained below with reference to FIG. 3 to FIG. 5. FIG. 4 is a cross-sectional view for explaining a programming operation of the fuse element shown in FIG. 1. FIG. 5 is a cross-sectional view for explaining a state after the programming operation of the fuse element shown in FIG. 1.

In programming the fuse element 31, the PMOS transistor 33 is set to an off-state by setting the bias signal Vvias to a high level, the NMOS transistor 34 is set to an off-state by setting the reading signal RE to a low level, and the program voltage Vpgm supplied to the first terminal 12a of the fuse element 31 is set to a high voltage (Vpgm=3.3V, for example). When the NMOS transistor 32 is set to an on-state by setting the program signal WE to a high level in this state, a current corresponding to the program voltage Vpgm rapidly flows to the second terminal 12c as a negative electrode side through the fuse link 12b from the first terminal 12a as a positive electrode side, in the fuse element 31. At this time, as shown in FIG. 4, electrons shift to the first terminal 12a as a positive electrode side through the fuse link 12b from the second terminal 12c as a negative electrode side.

While it depends on a shape of the fuse element 31, when a current flowing to the NMOS transistor 32 is set to around 5 to 10 milliamperes, for example, an electromigration phenomenon occurs in the silicide layer 23 on the polysilicon layer 22c-1 in the second terminal 12c at a base end side in a shift direction of electrons. A metal element of the silicide layer 23 on the polysilicon layer 22c-1 is pressed by a flow of electrons, and shifts to the fuse link 12b side.

At the same time, the polysilicon layer 22b of the fuse link 12b is fused by Joule heat generated by a current rapidly flowing through the silicide layer 23 of the fuse link 12b. Consequently, as shown in FIG. 5, a region 51 in which a metal element of the silicide layer 23 on the polysilicon layer 22c-1 is unevenly distributed is formed in the polysilicon layer 22b of the fuse link 12b in such a manner that substantially all metal element in the silicide layer 23 on the polysilicon layer 22c-1 is soaked into the polysilicon layer 22b of the fuse link 12b.

As a result, a resistance value substantially equal to that of the polysilicon layer 22c-1 is set in a region between the first terminal 12a and the second terminal 12c, and the fuse element 31 becomes a state having a high resistance. When an initial resistance value is programmed to a predetermined high resistance in the fuse element 31 in this way, the fuse element 31 thereafter keeps the programmed resistance value even when a current is blocked.

In FIG. 1, a width and a length of the fuse link 12b are determined according to a resistance value necessary to cause the fuse link 12b to generate Joule heat to fuse the polysilicon layer 22b. Because substantially all metal element in the silicide layer 23 on the polysilicon layer 22c-1 not doped with an impurity ion at the second terminal 12c is shifted to the fuse link 12b side, an interval width of the region 11c not doped with an impurity ion is determined by a relationship between this width and a length of the fuse link 12b.

As described above, according to the fuse element of the first embodiment, when it is programmed, a metal element on the polysilicon layer not doped with an impurity ion at a connection side of the second terminal is present unevenly in a form of soaking into the polysilicon layer at the fuse link side, and the second terminal is formed by only a polysilicon layer not doped with an impurity ion. Therefore, the fuse element becomes a state having a high resistance as a whole, and can obtain a stable program characteristic without being influenced by fluctuation in a program voltage.

Furthermore, because the polysilicon layer to form the fuse link is doped with an $N^+$ or $P^+$ impurity ion, compatibility with a layer (a silicide layer) containing a metal element laminated on this polysilicon layer can be maintained satisfactorily. In the fuse link, a silicide layer laminated on the polysilicon layer is not formed, and unevenness can be prevented. That is, the fuse element can securely maintain its reliability by preventing fluctuation in the initial resistance value.

Figure 6:
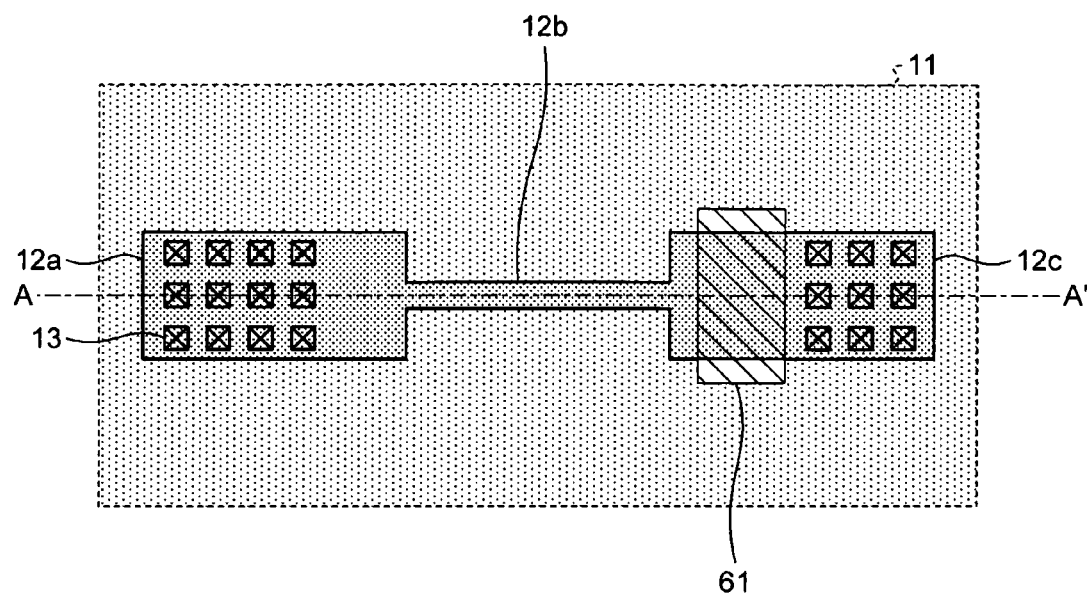
FIG. 6 is a layout diagram for explaining a basic configuration of a semiconductor device according to a second embodiment of the present invention.

FIG. 6 is a layout diagram for explaining a basic configuration of a semiconductor device according to a second embodiment of the present invention. For the sake of explanation, constituent elements which are identical or equivalent to those in the first embodiment are denoted by like reference numerals. Parts according to the second embodiment are mainly explained below.

A region 11 shown in FIG. 6 has a predetermined area into which an $N^+$ or $P^+$ impurity ion is doped, demarcated on a polysilicon layer. A fuse element according to the second embodiment is formed on the region 11. In the second terminal 12c, a region 61 crossing an end side connected to the fuse link 12b in a width direction of the fuse link 12b blocks a silicide layer as a layer containing a metal element.

That is, the fuse element according to the second embodiment has a configuration that a layer (a silicide layer) containing a metal element is laminated to form a total plane shape of the first terminal 12a, the fuse link 12b, and the second terminal 12c on a polysilicon layer doped with an $N^+$ or $P^+$ impurity ion. In the second terminal 12c, there is a region in which a silicide layer is not formed corresponding to a width of the region 61 that blocks the silicide layer, between the end side connected to the fuse link 12b and a side where the contacts 13 are formed.

Figure 7:
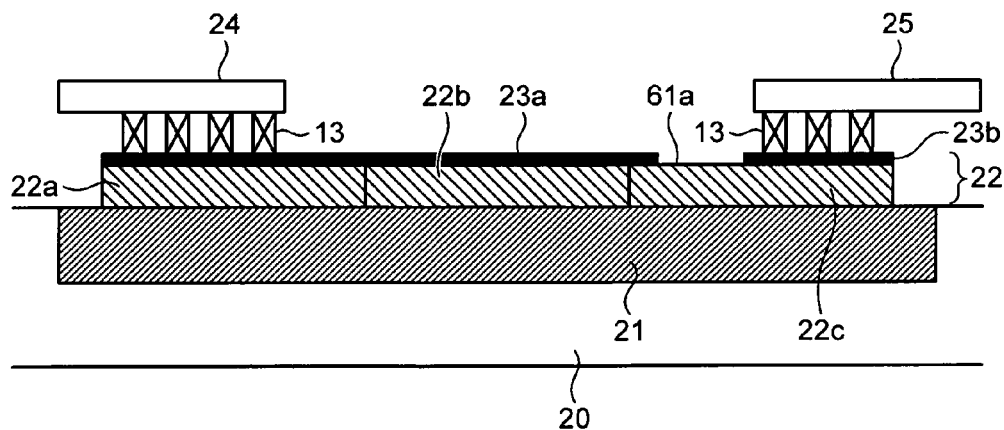
FIG. 7 is a cross-sectional view along a line A-A' in FIG. 6.

Specifically, the fuse element according to the second embodiment has a configuration shown in FIG. 7. FIG. 7 is a cross-sectional view along a line A-A' in FIG. 6. As shown in FIG. 7, the second terminal 12c has a configuration different from that in the first embodiment. First, a polysilicon layer 22c becoming a base is doped with an $N^+$ or $P^+$ impurity ion in the entire region. On the polysilicon layer 22c, the silicide layer 23 shown in the first embodiment is divided into a silicide layer 23a at the fuse link 12b side and a silicide layer 23b at a side in which the contacts 13 are formed, by a region 61a in which a silicide layer is not formed. In this configuration, an initial resistance value becomes slightly higher due to presence of the region 61a in which a silicide layer is not formed, but is limited to the second terminal 12c. Therefore, this gives little influence to a program.

Figure 8:
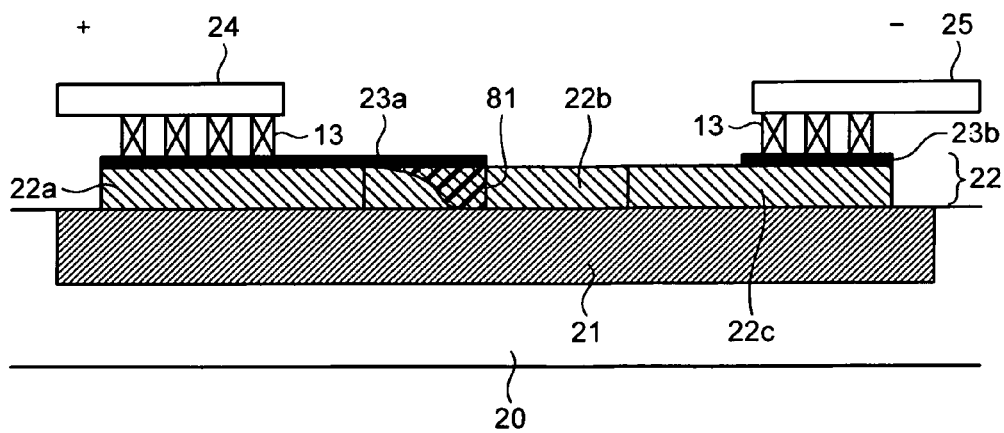
FIG. 8 is a cross-sectional view for explaining a state after a programming operation of a fuse element shown in FIG. 6.

FIG. 8 is a cross-sectional view for explaining a state after the programming operation of the fuse element shown in FIG. 6. In the second embodiment, at a programming time, a phenomenon that a metal element of the silicide layer 23a shifts to the first terminal 12a side as a positive electrode based on the electromigration phenomenon and fusing of the polysilicon layer 22b progress simultaneously, in a similar manner to that in the first embodiment. Therefore, in the second embodiment, a region in which a metal element of the silicide layer 23a is unevenly present is also formed in the polysilicon layer 22b of the fuse link 12b, in a similar manner to that in the first embodiment.

In this case, in the second embodiment, in FIG. 7, a metal element shifts in the silicide layer 23a present by a small amount at the end side of the second terminal 12c connected to the fuse link 12b and in the silicide layer 23a on the polysilicon layer 22b at the fuse link 12b side. As shown in FIG. 8, a region 81 in which a metal element of the silicide layer 23a is unevenly present is formed at a position deviated to the first terminal 12a side as a positive electrode side in the polysilicon layer 22b of the fuse link 12b. As a result, a part of the fuse link 12b becomes a region of only the polysilicon layer 22b, and the fuse element becomes a state having high resistance.

Therefore, the second embodiment can also achieve effects identical to those of the first embodiment.

Figure 9:
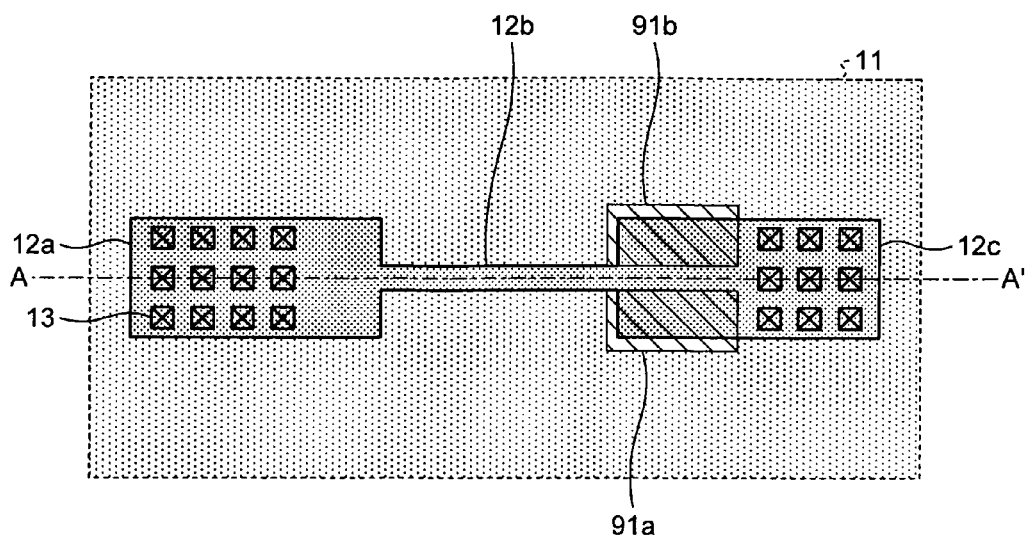
FIG. 9 is a layout diagram for explaining a basic configuration of a semiconductor device according to a third embodiment of the present invention.

FIG. 9 is a layout diagram for explaining a basic configuration of a semiconductor device according to a third embodiment of the present invention. For the sake of explanation, constituent elements which are identical or equivalent to those in the second embodiment are denoted by like reference numerals. Parts according to the third embodiment are mainly explained below.

In FIG. 9, in the second terminal 12c, regions 91a and 91b shown at the end side connected to the fuse link 12b block respectively a silicide layer as a layer containing a metal element. The regions 91a and 91b are provided to cover a space corresponding to a width of the fuse link 12b or the entire remaining part of a space prescribed by a design rule in the second terminal 12c at the end side connected to the fuse link 12b.

That is, the fuse element according to the third embodiment has a configuration that a layer (a silicide layer) containing a metal element is laminated to form a total plane shape of the first terminal 12a, the fuse link 12b, and the second terminal 12c on a polysilicon layer doped with an $N^+$ or $P^+$ impurity ion. In the second terminal 12c, a silicide layer of the fuse link 12b proceeds straight to a connection end at the second terminal 12c side in this narrow width shape and is connected to a silicide layer having a large width in which the contacts 13 are formed.

Figure 10:
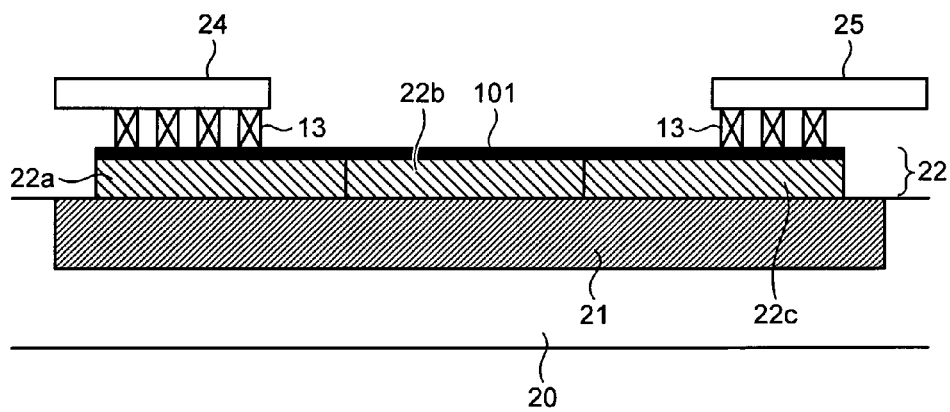
FIG. 10 is a cross-sectional view along a line A-A' in FIG. 9.

Specifically, the fuse element according to the third embodiment has a configuration shown in FIG. 10. FIG. 10 is a cross-sectional view along a line A-A' in FIG. 9. As shown in FIG. 10, the second terminal 12c has a configuration different from that in the second embodiment. A silicide layer 101 continuous to the fuse link 12b side is formed on the polysilicon layer 22c in the second terminal 12c. In this configuration, the initial resistance value can be reduced.

Figure 11:
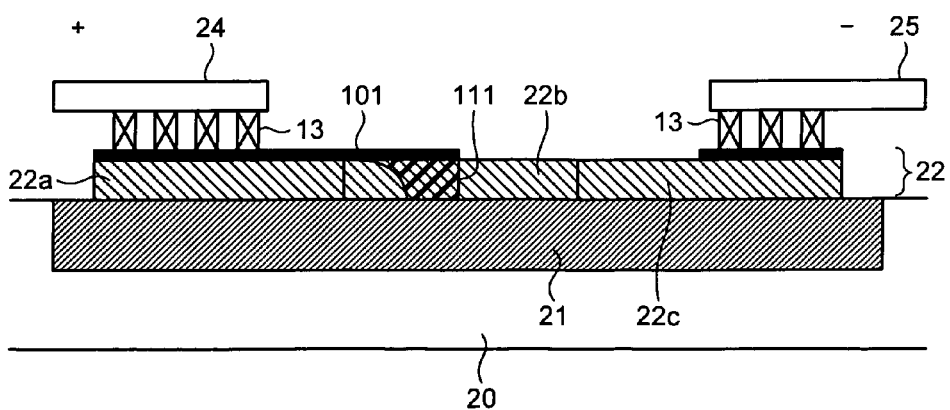
FIG. 11 is a cross-sectional view for explaining a state after a programming operation of a fuse element shown in FIG. 9.

An operation of performing programming is explained next. FIG. 11 is a cross-sectional view for explaining a state after the programming operation of the fuse element shown in FIG. 9. In the third embodiment, because a silicide layer is also formed at the end side of the second terminal 12c connected to the fuse link 12b, the end side of the second terminal 12c connected to the fuse link 12b has low resistance. However, the silicide layer is not formed in the entire area of the end side of the second terminal 12c connected to the fuse link 12b, but is formed in a narrow band region in the same width as that of the fuse link 12b.

Therefore, at a programming time, the operation that a metal element of the silicide layer 101 shifts to the first terminal 12a side as a positive electrode based on the electromigration phenomenon and the fusing of the polysilicon layer 22b progress simultaneously, in a similar manner to that in the first embodiment. Therefore, in the third embodiment, a region in which a metal element of the silicide layer 101 is unevenly present is also formed in the polysilicon layer 22b of the fuse link 12b, in a similar manner to that in the first embodiment.

In this case, in the third embodiment, in FIG. 10, a metal element of the silicide layer 101 shifts in the silicide layer 101 present by a small amount at the end side of the second terminal 12c connected to the fuse link 12b and in the silicide layer 101 on the polysilicon layer 22b at the fuse link 12b side. As shown in FIG. 11, a region 111 in which a metal element of the silicide layer is unevenly present is formed at a position deviated to the first terminal 12a side as a positive electrode side in the polysilicon layer 22b of the fuse link 12b. As a result, a part of the fuse link 12b becomes a region of only the polysilicon layer 22b, and the fuse element becomes a state having high resistance.

Therefore, the third embodiment can also achieve effects identical to those of the first embodiment.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a first terminal;
   a second terminal; and
   a fuse link that connects between the first terminal and the second terminal, wherein
   the first terminal and the fuse link have a polysilicon layer doped with an impurity ion and a layer containing a metal element laminated on the polysilicon layer, and
   the second terminal has a polysilicon layer not doped with an impurity ion and a layer containing a metal element laminated on the polysilicon layer, in at least a part of an end side connected to the fuse link.

2. The semiconductor device according to claim 1, wherein the first terminal is connected to a positive electrode side, and the second terminal is connected to a negative electrode side.

3. The semiconductor device according to claim 1, wherein the first terminal is connected to a positive electrode side, the second terminal is connected to a negative electrode side, and the metal element is unevenly present within the fuse link after passing a current in the fuse link.

4. The semiconductor device according to claim 1, wherein a length and a width of the fuse link are determined according to a resistance value necessary to cause the fuse link to generate Joule heat to fuse the polysilicon layer.

5. The semiconductor device according to claim 1, wherein an interval width of a region not doped with an impurity ion at an end side of the second terminal connected to the fuse link is determined by a relationship between the interval width and a length of the fuse link.

6. The semiconductor device according to claim 1, wherein an end of the fuse link connected to the second terminal is doped with an impurity ion such that the impurity ion enters a region of the second terminal not doped with an impurity ion.

7. The semiconductor device according to claim 1, wherein the impurity ion is a $N^+$ ion.

8. The semiconductor device according to claim 1, wherein the impurity ion is a $P^+$ ion.

9. The semiconductor device according to claim 1, wherein the metal element is any one of nickel, titanium, cobalt, and tungsten.

10. A programming method of a semiconductor device, which includes a first terminal, a second terminal, and a fuse link that connects between the first terminal and the second terminal, wherein
    the first terminal and the fuse link have a polysilicon layer doped with an impurity ion and a layer containing a metal element laminated on the polysilicon layer, and
    the second terminal has a polysilicon layer not doped with an impurity ion and a layer containing a metal element laminated on the polysilicon layer, in at least a part of an end side connected to the fuse link,
    the programming method comprising:
    fusing at least a part of the polysilicon layer of the fuse link by supplying a current to the fuse link, thereby causing the metal element to be unevenly present in the fused polysilicon layer.

* * * * *